(12) United States Patent
Kanbara et al.

(10) Patent No.: US 6,810,797 B2
(45) Date of Patent: Nov. 2, 2004

(54) METHOD OF RESIN-SEALING ELECTRONIC PARTS, AND STENCIL PRINTING PLATE USED THEREFOR

(75) Inventors: Kenji Kanbara, Otsu (JP); Kazuo Ando, Gifu (JP); Shiro Okada, Shiga (JP)

(73) Assignee: Toray Engineering Company, Limited, Osaka (JP)

(*) Notice: Subject to any disclaimer, the term of this patent is extended or adjusted under 35 U.S.C. 154(b) by 3 days.

(21) Appl. No.: 10/258,020

(22) PCT Filed: Jun. 28, 2001

(86) PCT No.: PCT/JP01/05588
§ 371 (c)(1),
(2), (4) Date: Oct. 18, 2002

(87) PCT Pub. No.: WO02/01625
PCT Pub. Date: Jan. 3, 2002

(65) Prior Publication Data
US 2003/0106443 A1 Jun. 12, 2003

(30) Foreign Application Priority Data
Jun. 29, 2000 (JP) ........................................ 2000-195747

(51) Int. Cl.⁷ ............................................... B41M 1/12
(52) U.S. Cl. ........................ 101/129; 101/127; 427/282; 118/406
(58) Field of Search ............................. 101/127, 127.1, 101/128.21, 128.4, 129, 114, 123, 124; 118/113, 406; 427/96, 97, 282

(56) References Cited

U.S. PATENT DOCUMENTS 6,319,851 B1 * 11/2001 Mihara et al. ............... 438/778
2003/0138553 A1 * 7/2003 Takenaka et al. ............. 427/96

FOREIGN PATENT DOCUMENTS

| JP | 09-039198 | 2/1997 |
| JP | 09-326407 | 12/1997 |
| JP | 11-074294 | 3/1999 |

* cited by examiner

Primary Examiner—Ren Yan
(74) Attorney, Agent, or Firm—Rader, Fishman & Grauer PLLC

(57) ABSTRACT

A resin-encapsulation method of the present invention for electronic parts by a stencil printing, in which a resin filling opening in a stencil is filled with a resin while a squeegee is being moved over the stencil, is characterized in that elevation control of the squeegee is made in a finish printing process at a position close to an end portion of the resin filling opening on a squeegee movement terminal side so as to scrape the excess of the filing resin out of the resin filling opening.

3 Claims, 3 Drawing Sheets

(a)

(b)

(c)

(d)

(a)

(b)

(c)

(d)

METHOD OF RESIN-SEALING ELECTRONIC PARTS, AND STENCIL PRINTING PLATE USED THEREFOR

TECHNICAL FIELD

The present invention relates to a resin-encapsulation method for electronic parts by a stencil printing, and a stencil to be used for the method.

BACKGROUND ART

In the prior art, it has been widely and generally executed to resin-encapsulate electronic parts mounted on a substrate by a stencil printing. As the electronic parts grow thinner and lighter, however, the demand is intensified day by day for finishing the thickness of the resin-encapsulated layer homogeneously.

As disclosed in Japanese unexamined patent publication (Kokai) No. 11-74294, therefore, at the squeegee movement terminal side end portions of the resin filling openings in a stencil, it has been proposed (as referred to FIG. 4) to form recesses for reserving the excess resin corresponding to a protuberance of the resin, as caused at the time of the forced fill of a encapsulation resin by a squeegee, thereby to prevent the heterogeneous thickness of the resin-encapsulated layer or to homogenize the thickness of the resin-encapsulated layer.

According to the aforementioned prior art method for forming the recesses, however, the stencil printing is performed several times by moving the squeegee back and forth thereby to force and fill a predetermined amount of resin in the resin filling openings of the stencil (as will be called the "filling printing"). After the final finish printing, the lower substrate carrying the electronic parts in the resin-encapsulated figure is then moved downward of and separated from the upper stencil on the stationary side. Then, the so-called "stringiness" is caused, as shown in FIG. 4(a), mainly by the excessive resin 5 which is left in the recess 10. When the substrate 1 is further moved downward, moreover, the resultant stringy resin is cut (as referred to FIG. 4(b)).

As a result, the thick and long stringy resin, as cut, on the substrate side may fall down either on the resin layer encapsulating the electronic parts or on the substrate so that its encapsulated figure is deformed (as referred to FIGS. 4(c) and 4(d)). This raises quality problems that especially the flatness of the resin-encapsulated layer drops to deteriorate the finished figure (or appearance) of the resin encapsulation, and that the resin sticks to such a portion on the substrate as should be cleared of the resin.

As the electronic parts are sequentially resin-encapsulated, on the other hand, the excess resin left in the aforementioned recess will be modified in their properties as the time elapses. As the case may be, the modified residual resin (e.g., a solidified resin lump) may migrate into a new resin to form a coarse surface. This point deteriorates the finished figure (or appearance) of the resin encapsulation and is not preferable for the quality.

The present invention has been conceived by noting those defects and contemplates to improve the appearance quality of the resin encapsulation and to homogenize the thickness of the resin-encapsulated layer.

DISCLOSURE OF THE INVENTION

In order to achieve the above-specified object, according to the present invention, there is provided a resin-encapsulation method for electronic parts by a stencil printing, in which a resin filling opening in a stencil is filled with a resin while a squeegee is being moved over the stencil. In the resin-encapsulation method, elevation control of the squeegee is so made in a finish printing process at a position close to an end portion of the resin filling opening on a squeegee movement terminal side as to scrape the excess of the filing resin out of the resin filling opening.

In the above-specified electronic parts resin-encapsulation method, the stencil having the resin scrape promoting recess connected to the end portion of the resin filling opening on the squeegee movement terminal side may be used, in the finish printing process, to bring the squeegee downward into the resin scrape promoting recess. Specifically, it is preferred that the resin-encapsulation stencil is provided with the resin scrape promoting recess connected to an end portion of the resin filling opening. It is preferred that the resin scrape promoting recess is connected to a plurality of resin filling openings, and is desired that the resin scrape promoting recess is longer than the width of the squeegee.

BEST MODE FOR CARRYING OUT THE INVENTION

Figure 1:
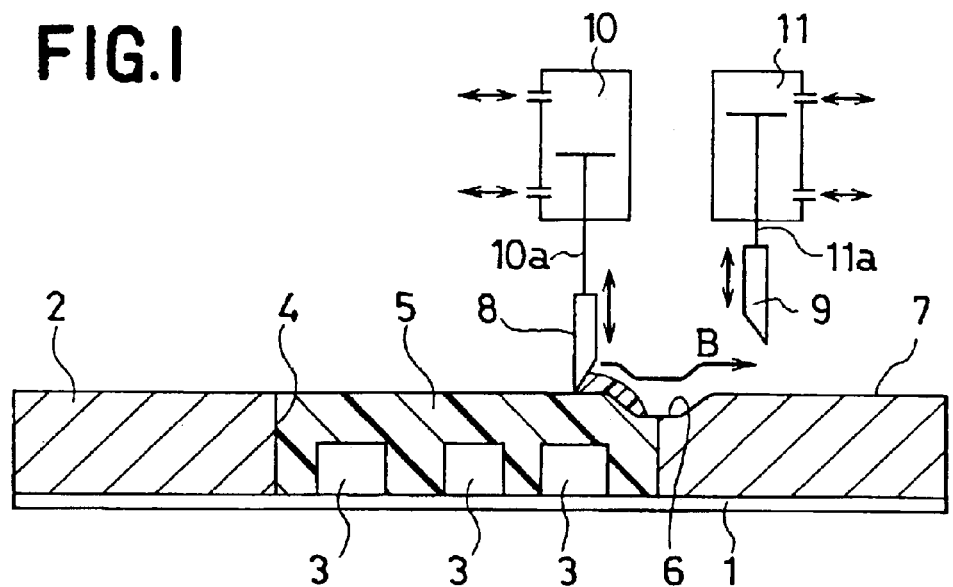
FIG. 1 is a sectional view showing a finish-printing mode according to an electronic parts resin-encapsulation method of the present invention.

Over a substrate 1 supported by the not-shown elevating table, as shown in FIG. 1, there is placed a stencil 2. A plurality of electronic parts 3 of a predetermined pattern are mounted on the substrate 1. In the stencil 2, on the other hand, resin filling openings 4 are formed therethrough of a predetermined pattern. Moreover, the substrate 1 and the stencil 2 are positioned in the figure to position the electronic parts 3 in the resin filling openings 4.

Figure 2:
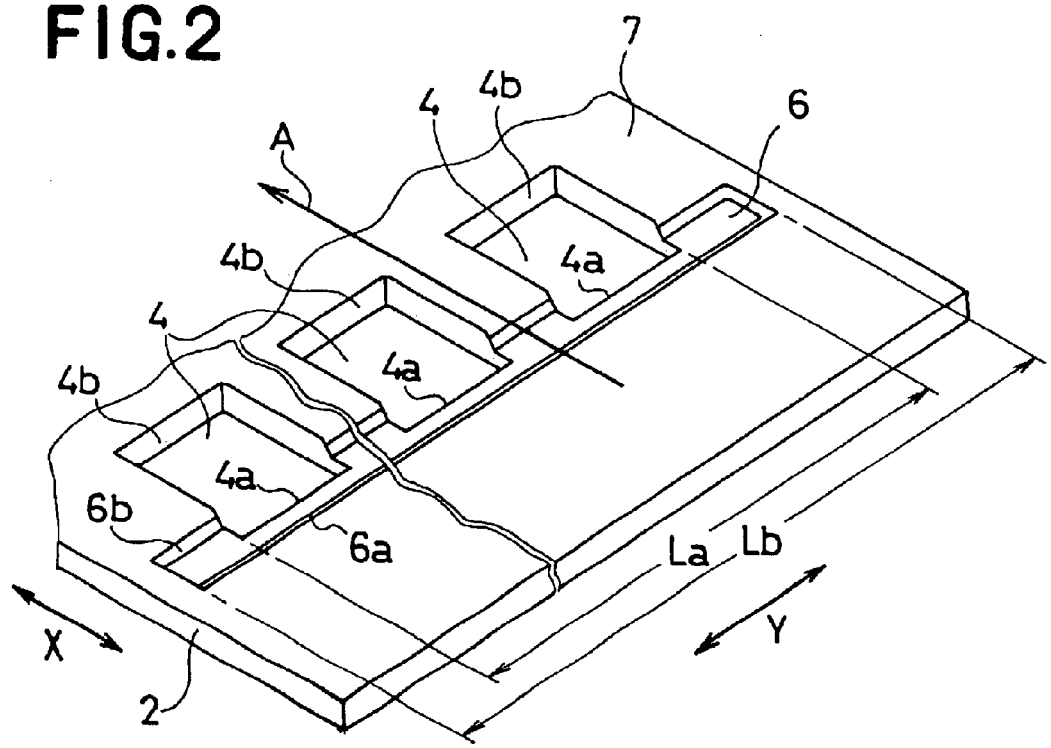
FIG. 2 is a perspective view of a stencil to be used in the electronic parts resin-encapsulation method of the present invention.

Here, the stencil 2 is so fixed on an apparatus frame that it may be positioned at a predetermined level, although not shown, and the substrate 1 is in the positioned state over the aforementioned table by predetermined locking means. As shown in FIG. 2, the stencil 2 is provided with a resin scrape promoting recess 6 which is connected to the individual ends of the plurality of resin filling openings 4.

This resin scrape promoting recess 6 is extended widthwise of the stencil 2, i.e., in the direction indicated by Y and is connected commonly to the plurality of resin filling openings 4. The length Lb of the resin scrape promoting recess 6 is set longer than the total width La of the resin filling openings 4 which are arranged widthwise of the stencil 2. On the other hand, the resin scrape promoting recess 6 forms side slopes 6a and 6b which are diverged from the bottom face to a stencil upper face 7.

Squeegees 8 and 9 are mounted on the leading ends of piston rods 1a and 11a of cylinders 10 and 11 which are so carried on the not-shown horizontal screw feed mechanisms as can be moved horizontally of FIG. 1.

It is, therefore, possible to move the squeegees 8 and 9 not only together to a predetermined horizontal position and but also individually or together to a predetermined vertical position. This squeegee 8 has a width (i.e., a length in the shown axial direction Y) set longer than the total width La of the resin filling openings 4 arranged in the widthwise direction of the stencil 2 but shorter than the length Lb of the resin scrape promoting recess 6. The squeegee 9 also has a width set to the equal length. However, this length of the squeegee 9 should not be limited thereto but in short may be set longer than the aforementioned total width La.

By feeding a encapsulation resin 5 to the stencil upper face 7 and by moving the squeegee 9, therefore, it is possible to force and fill the resin 5 into the resin filling openings 4, that is, to perform the filling printing.

At this time, the resin 5 to be filled for the printing is fed to the right end portion of the stencil upper face 7 in FIG. 1, and the squeegee 9 moved downward moves in the direction of arrow A (i.e., from the right side to the left side in FIG. 1), as shown in FIG. 2, while forcing the resin 5. Here, the squeegee 9 forces the stencil upper face 7 at its leading end and moves while keeping the forcing pressure constant.

In the filling printing thus far described, the other squeegee 8 moves, while being left above, together with the squeegee 9 in the direction of the arrow A. Subsequent to the end of the filling printing, the finish printing is performed by moving the squeegee 9 upward with the squeegee 8 having been moved downward.

This finish printing is performed to flatten the resin-encapsulated appearance for a predetermined quality and to homogenize the thickness of the resin-encapsulated layer, because only the filling printing causes a protuberance of the resin 5 in the opening regions close to the end portions 4b of the resin filling openings 4 on the squeegee movement terminal side on the squeegee movement terminal side and a coarse finish on the resin-encapsulated surface.

As the squeegees 8 and 9 move over the stencil upper face 7 on the lefthand side in FIG. 1 after the filling printing, the squeegee 9 moves upward whereas the squeegee 8 moves downward, and the squeegees 8 and 9 then move together to the righthand side.

In this finish printing, the squeegee 8 forces the stencil upper face 7 at its leading end and moves while keeping the forcing pressure constant. Therefore, the resin 5 having ended the filling printing and carried over to the lefthand stencil upper face 7 is forced and carried rightward by the squeegee 8.

At positions close to the end portions 4a of the resin filling openings 4 on the squeegee movement terminal side, moreover, the vertical movements of the squeegee 8 are controlled to scrape out the excess of the filling resin 5 from the resin filling openings 4. In short, the squeegee 8 is vertically controlled to draw a locus of arrow B, as shown in FIG. 1.

This vertical movement control is made by bringing the piston rod 10a of the air cylinder 10, as moved from the left to the right in FIG. 1, by a predetermined stroke so that the squeegee 8 is moved up and down along the slide slope 6a of the resin scrape promoting recess 6. Here, the excess amount of the resin to be scraped out of the resin filling openings 4 is determined by the preceding tests and is made different according to the several conditions including the kind of the resin, the size of the resin filling openings 4 and the thickness of the stencil 2.

By the aforementioned vertical movement controls keeping the movement of the squeegee 8 backward of the shown arrow A, the excess of the resin 5, as filled in the portions close to the end portions 4a of the resin filling openings 4 on the squeegee movement terminal side, is scraped out and carried over to the righthand stencil upper face 7 by the squeegee 8.

Figure 3:
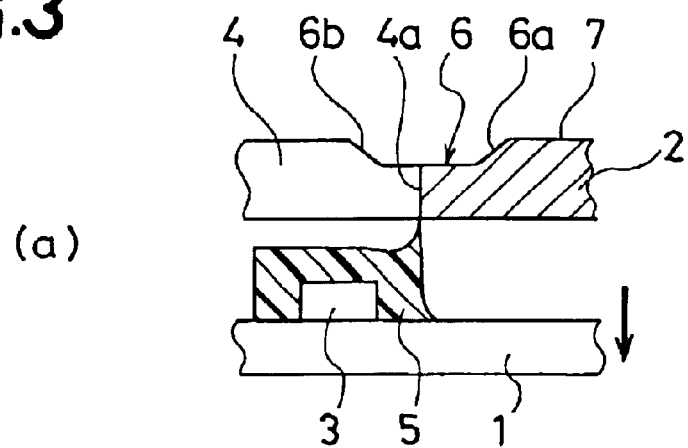
In FIG. 3 showing a modification of a resin-encapsulated mode due to a stringiness in the resin encapsulation of the present invention: (a) a diagram showing an initial state in which a substrate is separated from a fixed stencil; (b) a diagram showing a stringiness cutting state; (c) a diagram showing a state in which the cut stringiness is to fall down; and (d) a diagram showing a figure in which the cut stringiness has fallen down.
Figure 3:
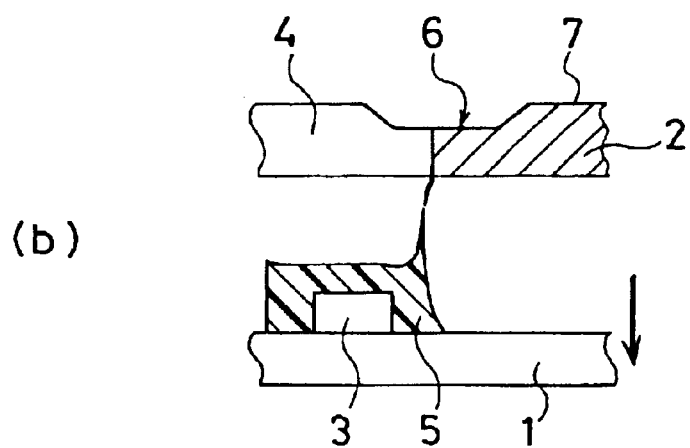
Figure 3:
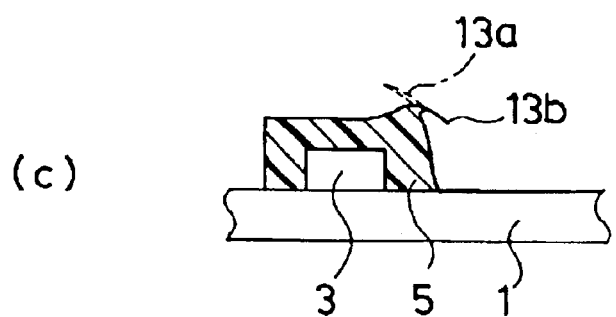
Figure 3:
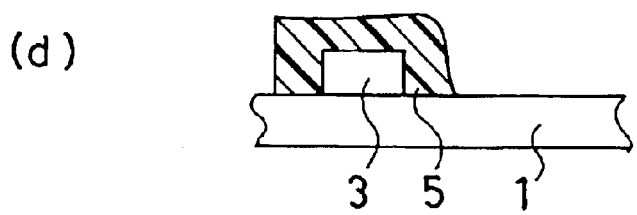
Figure 4:
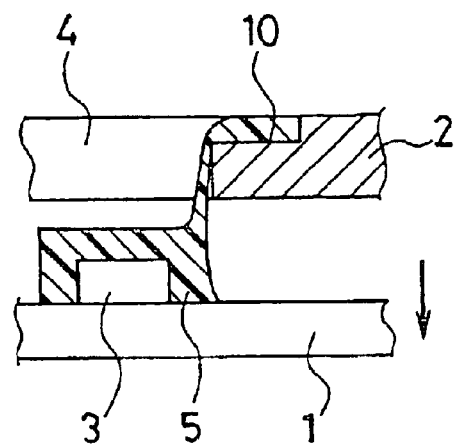
In FIG. 4 showing a modification of a resin-encapsulated mode due to a stringiness in the resin encapsulation of the prior art: (a) a diagram showing an initial state in which a substrate is separated from a fixed stencil; (b) a diagram showing a stringiness cutting state; (c) a diagram showing a state in which the cut stringiness is to fall down; and (d) a diagram showing a figure in which the cut stringiness has fallen down.
Figure 4:
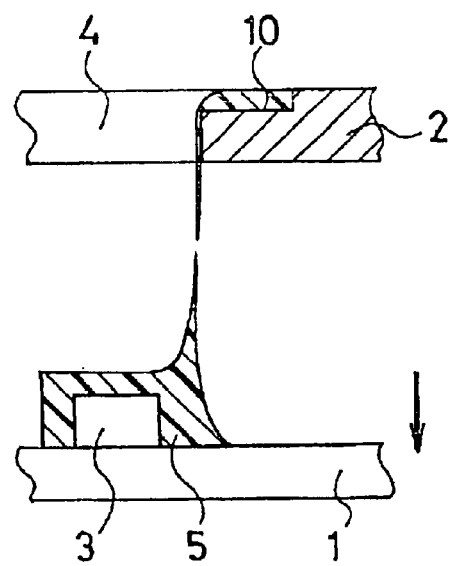
Figure 4:
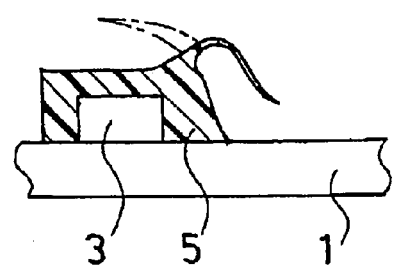
Figure 4:
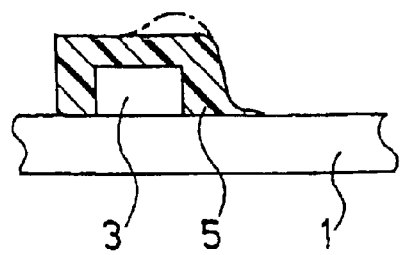

The aforementioned resin scrape can be smoothly performed because the side slopes 6a and 6b of the resin scrape promoting recess 6 are diverged (as referred to FIG. 3) from the bottom face to the stencil upper face 7.

The resin formed to protuberate at the end portions 4b on a squeegee movement terminal side in the aforementioned filling printing process, therefore, is forced and carried toward the end portions 4a on the other squeegee movement terminal side by the squeegee 8, as shown in FIG. 1, and the squeegee 8 arrives at the position close to the end portions 4a on the squeegee movement terminal side. Then, the action to scrape the summed excess resin of the aforementioned resin and a predetermined amount of resin out of the resin filling openings 4 can be started to prevent the resin from protuberate. As a result, it is possible to reduce the stringy resin which may be formed by the stringiness to occur when the lower substrate 1 carrying the resin-encapsulated electronic parts 3 is moved downward and separated from the upper stencil 2 on the stationary side, thereby to improve the finished figure (or appearance) of the resin encapsulation in quality.

When the aforementioned finish printing is ended, more specifically, the substrate 1 carrying the resin-encapsulated electronic parts 3 is moved relatively downward and is separated from the upper stencil 2 on the stationary side. At this time, the so-called "stringiness" occurs, as shown in FIG. 3(a).

The filling resin 5 at the portions close to the end portions 4a of the resin filling openings 4 on the squeegee movement terminal side is scraped out by the squeegee 8, as described hereinbefore, the stringy resin to be formed by the stringiness is thin. Therefore, the stringy resin is cut short (as referred to FIG. 3(b)), and these resin cuts on the substrate side fall on either the resin layer encapsulating the electronic parts 3 or the substrate 1.

In FIG. 3(c), a stringy resin 13a to fall on the resin layer is indicated by chain lines, and a stringy resin 13b to fall on the substrate 1 is indicated by solid lines. These stringy resins are thin and short, even if they fall, that is, they are in a small quantity. Therefore, it is possible to prevent the encapsulated figure from being excessively deformed (especially in a deterioration in the flatness) and the resin from sticking to the unnecessary portion on the substrate side. This fall cannot be recognized at a glance so that the finished figure (or appearance) of the resin encapsulation can be improved in quality from this point (as referred to FIG. 3(d)).

In addition, the resin 5 is not left in the resin scrape promoting recess 6 so that a new resin can always be exclusively filled for the encapsulation in the resin filling openings 4. Therefore, it is possible to prevent that the residual of the resin having been used in the preceding resin encapsulation solidifies, and that the resin lump migrates into a new resin to be used for a subsequent resin encapsulation causing the encapsulated surface to become coarse. From this point, it is possible to improve the quality of the finished figure (or appearance) of the resin encapsulation. Here, the squeegee 8 having ended the finish printing is moved upward from the stencil upper face 7 on the righthand side of FIG. 1 to restore its standby state.

In the present invention, the filling printing and the finish printing are usually performed one time but may be done several times, if necessary. The stencil should not either be limited to one having the plurality of resin filling openings but may have only one. The material to be selected for the stencil is usually stainless steel but may be another suitable.

The pattern to be selected for the resin filling openings can be a predetermined one, if necessary, as exemplified by a pattern in which only the central one of the plurality of resin filling openings shown in FIG. 2 is moved to a predetermined position in a direction X. In this case, too, it is preferred to the resin scrape promoting recess (separately in addition to the shown resin scrape promoting recess 6) is connected to one end of the moved resin filling opening.

The stage elevating means should not either be limited to the air cylinder but may be suitably selected into another proper elevating means, and the squeegee horizontal moving means can also be suitably selected.

On the other hand, the substrate may also have any thickness or material such as a resin film substrate or a ceramic substrate, and no limit is made to the electronic parts to be mounted thereon. Nor is limited the encapsulation resin to be used.

Here will be described an example.

This example was resin-encapsulated under the following conditions (a) to (e).

(a) Substrate: Substrate having sixteen IC chips mounted thereon in a lattice shape.
(b) Stencil:
  Thickness: 0.9 mm
  Size of resin filling openings: 50 mm×50 mm (capable of encapsulating one substrate)
  Number of resin filling openings:
    Eight in the lattice shape
  Width of resin scrape promoting recess: 8 mm
  Biting width of one end of resin filling openings with respect to recess: 3 mm
  Depth of recess: 0.15 mm
  Total length of recess: 280 mm
(c) Squeegee width: 270 mm
(d) Encapsulation resin:
  Viscosity: 100 Pa·S (at 25° C.)
  Thixotropy index: 1.2 (at 25° C.)
(e) Squeezing Rate: 5 mm/sec.

The resin-encapsulation was performed with the stencil set over eight substrates, and the resin-encapsulated thickness was measured. The result is that the average was 0.74 mm and that the maximum was 0.78 mm.

On the other hand, the resin encapsulation was made under the identical conditions excepting that the resin scrape promoting recess was not formed. The average was 0.75 mm, and the maximum was 0.88 mm. From this, the embodiment having the resin scrape promoting recess is found to be advantageous.

INDUSTRIAL APPLICABILITY

According to the present invention, as has been described hereinbefore, the finish printing can be made without any resin protuberance at the end portions of the resin filling openings on the squeegee movement terminal side. The resin-encapsulated figure can also be prevented from being excessively deformed by the stringiness which occurs when the stencil is separated from the substrate after the finish printing. In the resin encapsulation, moreover, the resin filling openings can always be filled exclusively with a new resin thereby to prevent the solidified resin lump from migrating. Therefore, the appearance quality of the resin encapsulation can be improved to homogenize the thickness of the resin-encapsulated layer.

What is claimed is:

1. A resin-encapsulation method for electronic parts by a stencil printing, in which a resin filling opening in a stencil is filled with a resin while a squeezee is being moved over said stencil, characterized in that elevation control of said squeezee is made in a finish printing process at a position close to an end portion of said resin filling opening on a squeezee movement terminal side so as to scrape the excess of the filing resin out of said resin filling opening wherein the stencil having the resin scrape promoting recess connected to the end portion of said resin filling opening on the squeegee movement terminal side is used, in the finish printing process, to bring said squeezee downward into said resin scrape promoting recess.

2. A resin-encapsulation method for electronic parts as set forth in claim 1, characterized in that said resin scrape promoting recess is connected to a plurality of resin filling openings.

3. A resin-encapsulation method for electronic parts as set forth in claim 1 or 2, characterized in that the squeegee has a length in a widthwise direction extending perpendicularly to a moving direction of the squeegee such that the resin scrape promoting recess is longer than the length of the squeegee.

* * * * *